(12) United States Patent
Strutz et al.

(10) Patent No.: US 8,969,985 B2
(45) Date of Patent: Mar. 3, 2015

(54) SEMICONDUCTOR CHIP PACKAGE AND METHOD

(75) Inventors: Volker Strutz, Tegernheim (DE); Stefan Landau, Wehrheim (DE); Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 717 days.

(21) Appl. No.: 13/221,607

(22) Filed: Aug. 30, 2011

(65) Prior Publication Data
US 2013/0049746 A1 Feb. 28, 2013

(51) Int. Cl.
| | |
|---|---|
| H01L 27/22 | (2006.01) |
| H01L 23/04 | (2006.01) |
| H01L 23/48 | (2006.01) |
| H01L 25/16 | (2006.01) |
| H01L 43/04 | (2006.01) |
| G01R 33/07 | (2006.01) |
| G01R 33/00 | (2006.01) |
| H01L 23/00 | (2006.01) |
| H01L 23/31 | (2006.01) |

(52) U.S. Cl.
CPC ............... *H01L 23/04* (2013.01); *H01L 23/48* (2013.01); *H01L 25/16* (2013.01); *H01L 43/04* (2013.01); *G01R 33/07* (2013.01); *G01R 33/0047* (2013.01); *H01L 24/18* (2013.01); *H01L 23/3121* (2013.01); *H01L 23/3171* (2013.01)

USPC .......................................... 257/427; 257/666

(58) Field of Classification Search
CPC ..... H01L 23/04; H01L 23/48; H01L 23/3121; H01L 23/3171
USPC .................. 257/741, 427, E29.323, E23.067, 257/E21.502
See application file for complete search history.

(56) References Cited

U.S. PATENT DOCUMENTS

| | | | |
|---|---|---|---|
| 6,038,135 A * | 3/2000 | Higashiguchi et al. | ........ 361/778 |
| 6,759,841 B2 * | 7/2004 | Goto et al. | ................ 324/117 H |
| 2002/0041023 A1 * | 4/2002 | Sakamoto et al. | ............ 257/706 |
| 2002/0172025 A1 | 11/2002 | Megahed et al. | |
| 2005/0236698 A1 * | 10/2005 | Ozawa et al. | ................. 257/666 |
| 2006/0220189 A1 * | 10/2006 | Sakamoto et al. | ............ 257/666 |
| 2009/0207338 A1 * | 8/2009 | Kondo et al. | ................... 349/62 |
| 2009/0309202 A1 * | 12/2009 | Hsu et al. | ...................... 257/680 |

FOREIGN PATENT DOCUMENTS

CN 1841728 A 10/2006

* cited by examiner

*Primary Examiner* — Yu-Hsi D Sun
*Assistant Examiner* — Christina Sylvia
(74) *Attorney, Agent, or Firm* — Slater & Matsil, L.L.P.

(57) ABSTRACT

A semiconductor chip package and a method to manufacture a semiconductor chip package are disclosed. An embodiment of the present invention comprises a substrate and a semiconductor chip disposed on the substrate and laterally surrounded by a packaging material. The package further comprises a current rail adjacent the semiconductor chip, the current rail isolated from the semiconductor chip by an isolation layer, a first external pad, and a via contact contacting the current rail with the first external pad.

20 Claims, 5 Drawing Sheets

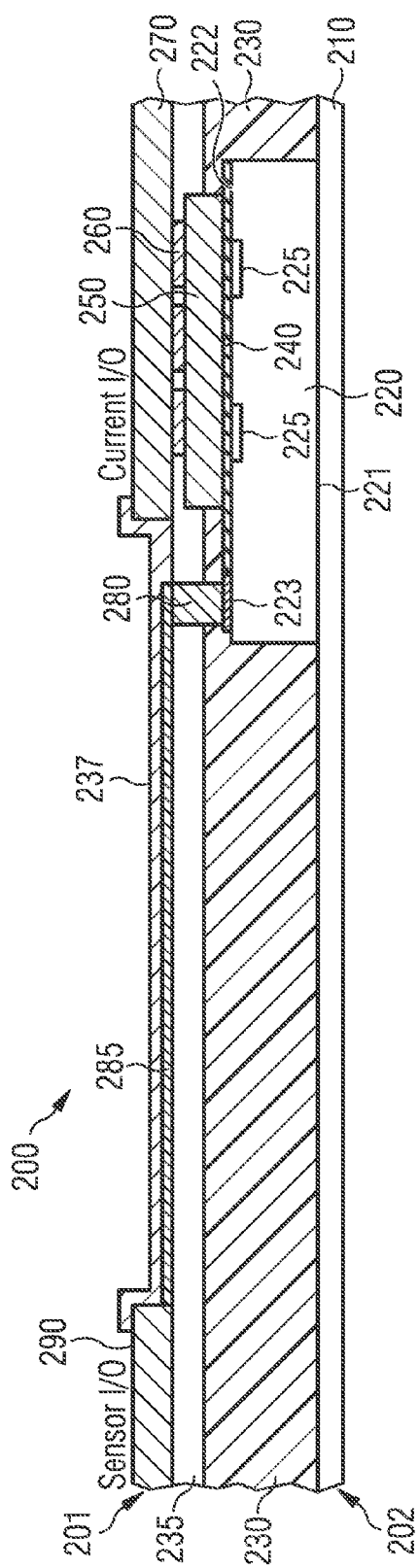

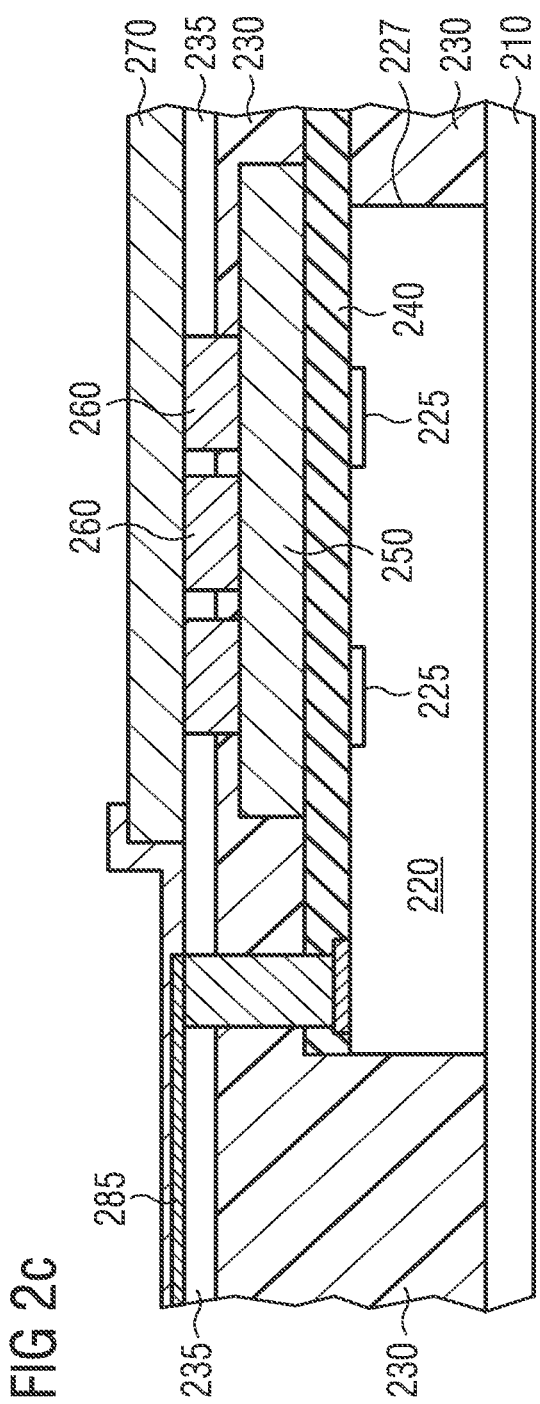

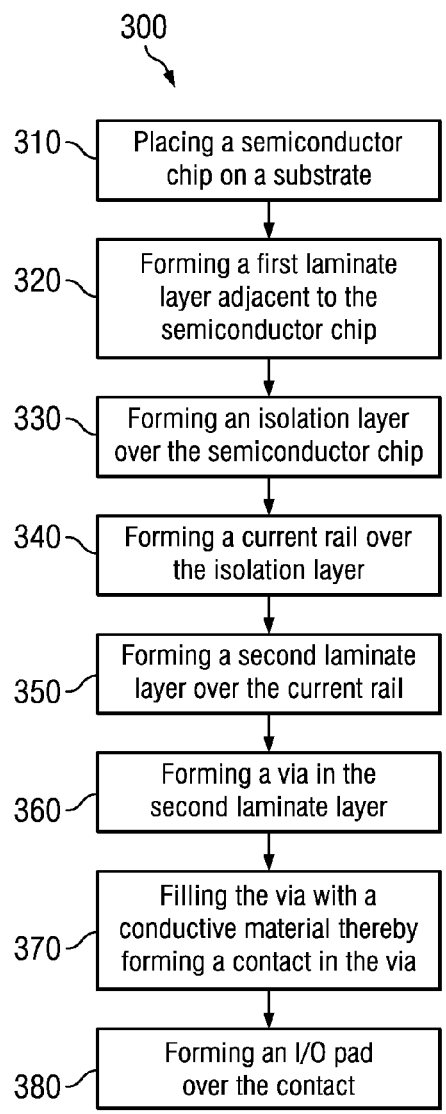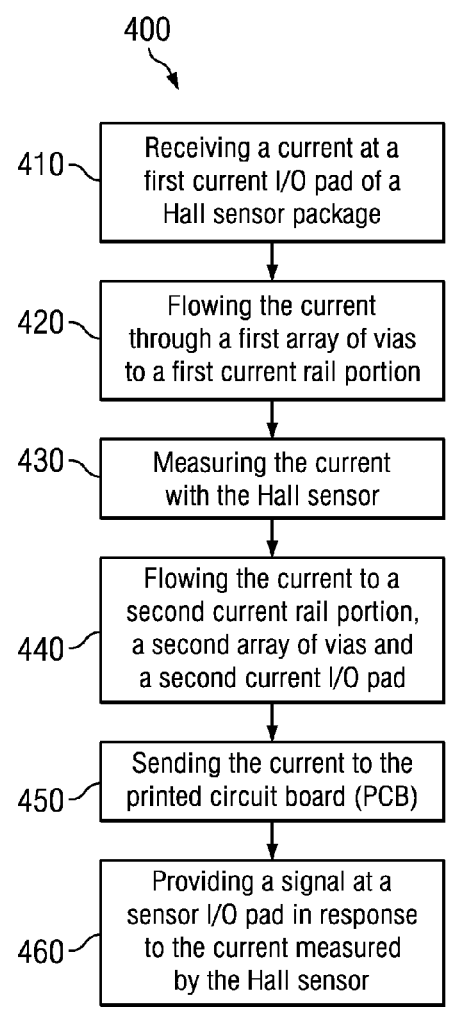
FIG. 3
FIG. 4

SEMICONDUCTOR CHIP PACKAGE AND METHOD

TECHNICAL FIELD

The present invention relates generally to a semiconductor chip package and a method for making a semiconductor chip package, and, in particular embodiments, to a Hall sensor package and method for making a Hall sensor package.

BACKGROUND

A Hall sensor is a transducer that varies its output voltage in response to a measured magnetic field. In its simplest form, the Hall sensor operates as an analogue transducer, directly returning a voltage for the measured field.

Electricity carried through a conductor will produce a magnetic field that varies with current, and a Hall sensor measures the current without interrupting the circuit.

Hall sensors are typically used in industrial applications such as pneumatic cylinders, or in consumer equipment such as computer printers or keyboards.

Hall sensors are also commonly used to time the speed of wheels and shafts, such as for internal combustion engine ignition timing, tachometers and anti-lock braking systems. They are used in brushless DC electric motors to detect the position of the permanent magnet.

SUMMARY OF THE INVENTION

In accordance with an embodiment of the present invention, a package for a semiconductor device comprises a substrate and a semiconductor chip disposed on the substrate and laterally surrounded by packaging material. The package further comprises a current rail adjacent the semiconductor chip, the current rail isolated from the semiconductor chip by an isolation layer, a first external pad, and a via contact contacting the current rail with the first external pad.

In accordance with another embodiment of the present invention, a method for making a package comprises placing a semiconductor chip on a substrate, forming a first laminate layer adjacent to the semiconductor chip, and forming a current rail over the semiconductor chip. The method further comprises forming a second laminate layer over the current rail, forming a via in the second laminate layer, filling the via forming a via contact, and forming an external pad over the via contact.

In accordance with another embodiment of the present invention, a multi chip package comprises a substrate, a Hall sensor disposed on the substrate and at least one further semiconductor chip disposed on the substrate. The multi chip package further comprises a packaging material surrounding the Hall sensor and the at least one further semiconductor chip, a current rail adjacent the Hall sensor, the current rail isolated from the Hall sensor by an isolation layer, an external pad, and a via contact contacting the current rail with the external pad.

In accordance with another embodiment of the present invention, a method to use a Hall sensor comprises receiving a current at a first current I/O pad of an Hall sensor package from a printed circuit board, flowing the current through first array of contact vias to a first current rail, the first current rail disposed adjacent to the Hall sensor, and measuring the current with the Hall sensor. The method further comprises flowing the current to a second current rail, a second array of contact vias and a second current I/O pad, and sending the current to the printed circuit board back.

In accordance with an embodiment of the present invention, a package for a semiconductor device comprises a substrate and a semiconductor chip disposed on the substrate and laterally surrounded by a laminate material layer comprising a laminate material. The package further comprises a current rail adjacent the semiconductor chip, the current rail isolated from the semiconductor chip by an isolation layer, a first external pad, and a contact contacting the current rail with the first external pad.

BRIEF DESCRIPTION OF THE DRAWINGS

For a more complete understanding of the present invention, and the advantages thereof, reference is now made to the following descriptions taken in conjunction with the accompanying drawings, in which:

FIG. 2a shows a cross-sectional view of an embodiment of a semiconductor chip package;

FIG. 2b shows an embodiment of a detail of the semiconductor chip package;

FIG. 2c shows an embodiment of a detail of the semiconductor chip package;

FIG. 3 shows a flow chart of a method to manufacture a semiconductor chip package; and FIG. 4 shows a flow chart of a method to use the semiconductor chip package.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a Hall sensor package. The invention may also be applied, however, to other semiconductor chip packages.

Figure 1:
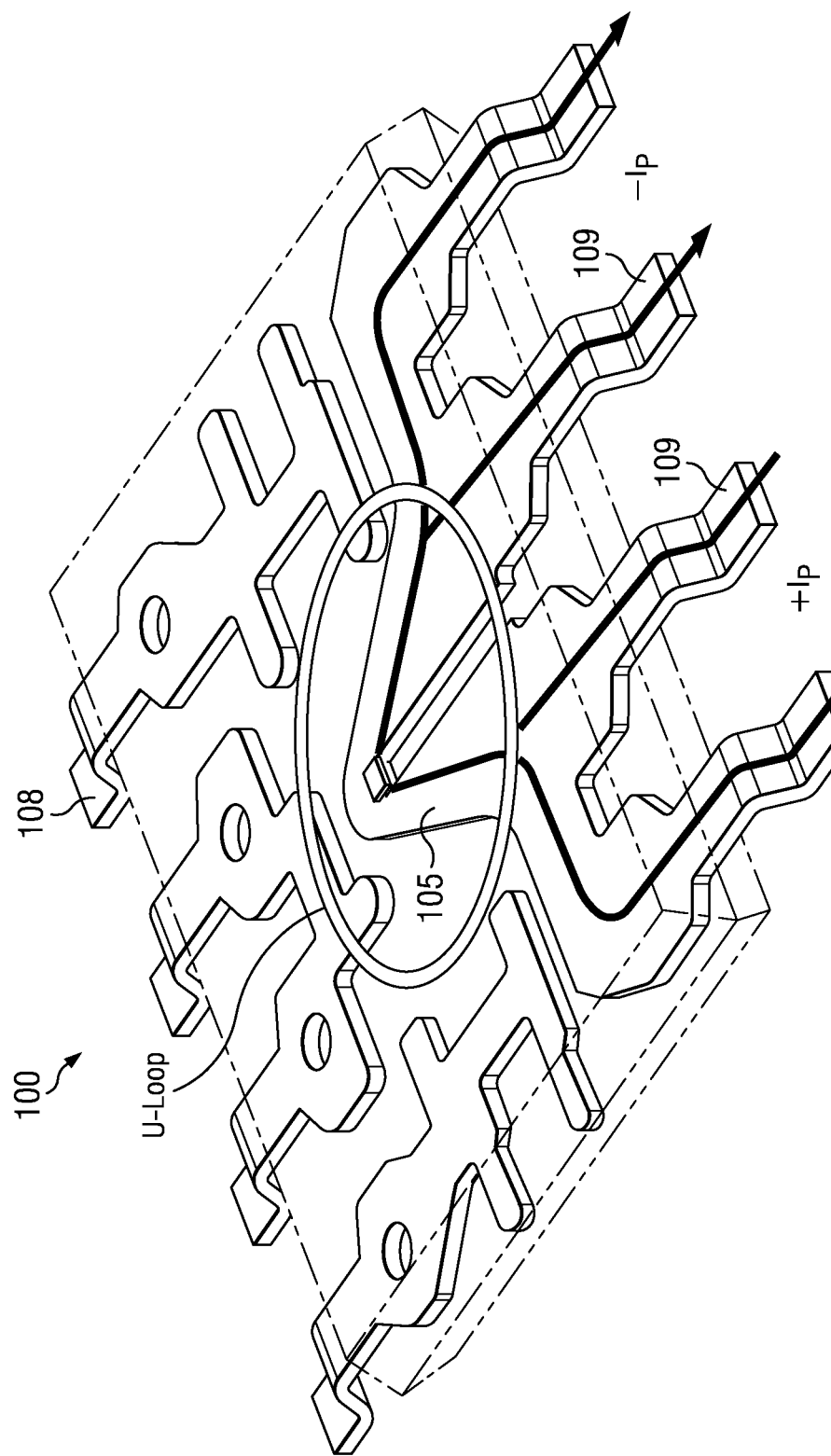
FIG. 1 shows a conventional Hall sensor using a leadframe based package.

FIG. 1 shows a conventional Hall sensor package 100, wherein a current rail 105 is a portion of the leadframe 108. The Hall sensor is separated from the current rail/leadframe 105/108 by an isolation layer. A disadvantage of such an arrangement is that the current traces 109 to the current rail 108 are relatively long and therefore the resistances of these current traces 109 are relatively high. Moreover, the isolation layer between the Hall sensor and the current rail is relatively thick which reduces the magnetic field strength and which may contribute significantly to a sensor drift.

These and other problems are generally solved or circumvented, and technical advantages are generally achieved, by embodiments of the present invention which comprise a semiconductor chip package wherein the semiconductor chip package is formed using laminate layers. A further embodiment of the present invention comprises contact vias electrically connecting an I/O pad and a current rail or metallization disposed adjacent to the semiconductor chip. An additional embodiment comprises a thin isolation layer located between the semiconductor chip and the current rail/metallization. In one embodiment the semiconductor chip package does not comprise a leadframe.

An advantage of an embodiment of the present invention is that the semiconductor chip package uses short distances for the current path to bring the current close to and to lead the current away from the semiconductor chip. A further advantage is that the current path is guided closely to the semiconductor chip and the functional elements. A still further advantage is that the semiconductor chip package can be manufactured with a high degree of freedom and precision or accuracy as compared to currently available packages. A final advantage is that only one conductive material may be used for the current path and that material interfaces in the current path may be avoided.

FIG. 2a shows a cross sectional view of an embodiment of a semiconductor package 200. The package 200 comprises a substrate 210 and a semiconductor chip 220 arranged on the substrate 210. The semiconductor chip 220 is embedded in packaging layers 230, 235. An isolation layer 240 is disposed over the semiconductor chip 220. A current rail 250 is disposed over the isolation layer 240. A first external pad 270 is arranged over the current rail 250 and the first external pad 270 is electrically connected with the current rail 250 through at least one via contact 260. The semiconductor chip 220 is electrically connected to a second external pad 290 via routing 285, a contact 280 and a chip pad 223.

The semiconductor chip 220 is a stand-alone device or an integrated circuit. The semiconductor chip 220 comprises a top side 222 and a back side 221. Active areas and functional elements 225 may be located in or close to the top side 222 of the semiconductor chip 220. The functional elements 225 may be sensing elements such as Hall elements and/or magnetic sensing elements such as xMR elements. For example, the magnetic sensing element may be an anisotropic magnetoresistance (AMR) element, a giant magnetoresistance (GMR) element, etc. Alternatively or additionally, the functional elements 225 may be any active elements such as diodes, transistors, thyristors or memory elements. The semiconductor chip 220 further comprises a chip pad 223 arranged on the surface of the top side 222. The back side 221 of the semiconductor chip 220 is in contact with the substrate 210. The substrate 210 may isolate the semiconductor chip 220 from the exterior of the package 200.

The semiconductor chip 220 is at least laterally surrounded by a packaging layer 230. The packaging layer 230 may completely surround the semiconductor chip 220. The packaging layer 230 may be a laminate layer or a composite layer. Alternatively, the packaging layer may comprise other materials. For example, the laminate layer 230 may be an epoxy, a polymer based epoxy, a glass fiber reinforced epoxy or a resin coated copper (RCC). Alternatively, the laminate layer 230 may be a fiber reinforced phenolic hardening epoxy resin. The laminate layer 230 may comprise a plurality of layers. For example, the laminate layer 230 may comprise a halogen free, high elastic modulus, and/or low CTE multilayer material. In one embodiment the laminate layer does not comprise an epoxy resin molding material.

A current rail 250 may be disposed over the semiconductor chip 220. The current rail 250 may be an on-chip metallization or may be deposited as a separate layer in the packaging layer 230. The current rail 250 comprises a conductive material. For example, the current rail 250 may be a metal such as copper, aluminum, tungsten or a combination thereof. Alternatively, the current rail 250 may comprise other conductive materials. A portion of the current rail 250 is disposed adjacent to the functional elements 225. In one embodiment current rail 250 comprises a reduced cross section or constriction in the vicinity of the functional elements 225 so that a current flow flowing through the current rail 250 is increased at the constriction. The constriction may be arranged closer to the semiconductor chip 220 (and the functional elements 225) than the rest of the current rail 250.

The current rail 250 is isolated from the semiconductor chip with an isolation layer 240. The isolation layer 240 may comprise an oxide such as a silicon oxide or a nitride such as a silicon nitride. Alternatively, the isolation layer 240 comprises polimid or a laminate material.

A first external pad or a current I/O pad 270 may be located in an upper part 201 of the package 200. For example, the current I/O pad 270 may be arranged in an upper part of the laminate layer 235 or in the uppermost laminate layer 235. The current I/O pad 270 may be a solderland.

The current I/O pad 270 is electrically connected the current rail 250. The connection may be established by a contact, a plurality of contacts or an array of contacts 260. The contact or contacts 260 may be via contacts. For example, the contact or contacts 260 may be an array of via contacts disposed substantially vertical to the current rail 250 surface or the semiconductor chip 220 surface. Alternatively, the contact or contacts 260 may be formed having other geometrical features. Such an arrangement may have the advantage that the distance from the current I/O pad 270 to the current rail 250 is very short. The current I/O pad 270 may be designed for current applications with high currents such as currents with up to 100 A or currents with up to 50 A.

The current I/O pad 270 and the via contacts 260 may comprises a conductive material. For example, the current I/O pad and the via contacts 260 may comprise a metal such as copper, aluminum, tungsten, nickel or a combination thereof. Alternatively, palladium and gold may be used. In one embodiment the conductive material for the current I/O pad 270, the via contacts 260 and the current rail 250 is the same. Alternatively, the conductive material for the current I/O pad 270, the contacts 260 and the current rail 250 comprises at least two different metals.

The diameter of a via contact 260 may be in the range from about 40/50 μm to about 100/150 μm. The height of the via contact 260 (including the height of the current I/O pad 270) may be in the range from about 10 μm to about 150 μm. The height of the whole metallization stack (current rail 250, via contact 260, current I/O pad 270) may be in the range of up to about 350/400 μm. In one embodiment the via contact 260 is at least as wide or wider than it is high. The via contact 260 may comprise an aspect ratio of 1/1-1/1.5. Alternatively, the contact via 260 is higher than it is wide, for example the via contact 260 may comprise an aspect ratio of 1/1-0.8/1.

A second external pad or a sensor I/O pad 290 may also be formed in the upper part 201 of the package 200. For example, the sensor I/O pad 290 may be arranged in an upper part of the laminate layer 235 or in the uppermost laminate layer 235. The sensor I/O pad 290 is electrically connected via a routing 285 to the chip pad 223. The routing 285 may comprise one or several metallization layers in the laminate layers 230, 235. The sensor I/O pad 290 and the routing 285 may comprise a conductive material. For example, the sensor I/O pad 290 and the routing 285 may comprise a metal such as copper, aluminum, tungsten or a combination thereof. The current I/O pad 290 and the routing 285 may be designed for signal and chip supply voltages.

The first external I/O pad 270 and the second external I/O pad 290 may be galvanically isolated from each other. Creepage and clearance specifications may provide conditions which should be met.

In one embodiment the current rail 250 may be disposed over the top surface and around the side walls of the semiconductor chip 220. Alternatively, the current rail 250 may be arranged exclusively around a sidewall or several sidewalls. Moreover, the semiconductor chip 220 may be arranged in the package 200 so that the functional elements 225 face toward the substrate 210. In such a configuration the current rail 250 may be arranged between the isolation layer 210 and the semiconductor chip 220. An isolation layer 240 may be disposed between the functional elements 225 and the current rail 250.

FIG. 2b shows a detail of an embodiment of FIG. 2a. In particular, FIG. 2b shows an embodiment where the current rail 250 is an on chip metallization and where the isolation layer 240 comprises silicon oxide, silicon nitrid, or a polimid.

In this embodiment the isolation layer 240 is a thin isolation layer 240. The thin isolation layer 240 is arranged over a top surface 222 of the semiconductor chip 220 and close to the functional elements 225. The thin isolation layer 240 may comprise a thickness of about 5 μm to about 20 μm. Alternatively, the thin isolation layer 240 comprises a thickness of about up to 50 μm. In one embodiment the thin isolation layer 240 should not be thicker than about 150 to about 200 μm. Generally, the thin isolation layer 240 may comprise a larger thickness for applications with higher amounts of voltages. In one embodiment the current rail 250 may only overlie a portion of the top surface 222 of the semiconductor chip 220.

FIG. 2c shows detail of another embodiment of FIG. 2a. In particular, FIG. 2c shows an embodiment where the current rail 250 is disposed in the laminate layer 230 adjacent to the semiconductor chip 220.

The thin isolation layer 240 may be arranged over a top surface 222 of the semiconductor chip 220 and close to the functional elements 225. The thin isolation layer 240 may be materials such as a laminate material or an imid material. The thin isolation layer 240 may comprise a laminate layer and an oxide/and or nitride layer. The thin isolation layer 240 may comprise a thickness of about 5 μm to about 20 μm. Alternatively, the thin isolation layer 240 comprises a thickness of about up to 50 μm. In one embodiment the thin isolation layer 240 should not be thicker than about 150 to about 200 μm. Generally, the thin isolation layer 240 may comprise a larger thickness for applications with higher amounts of expected voltages. In one embodiment the current rail 250 may overlie the top surface 222 and horizontally extend beyond an edge 227 of the semiconductor chip 220. Alternatively, the current rail 250 may only overlie a portion of the top surface 222 of the semiconductor chip 220.

Figure 2D:
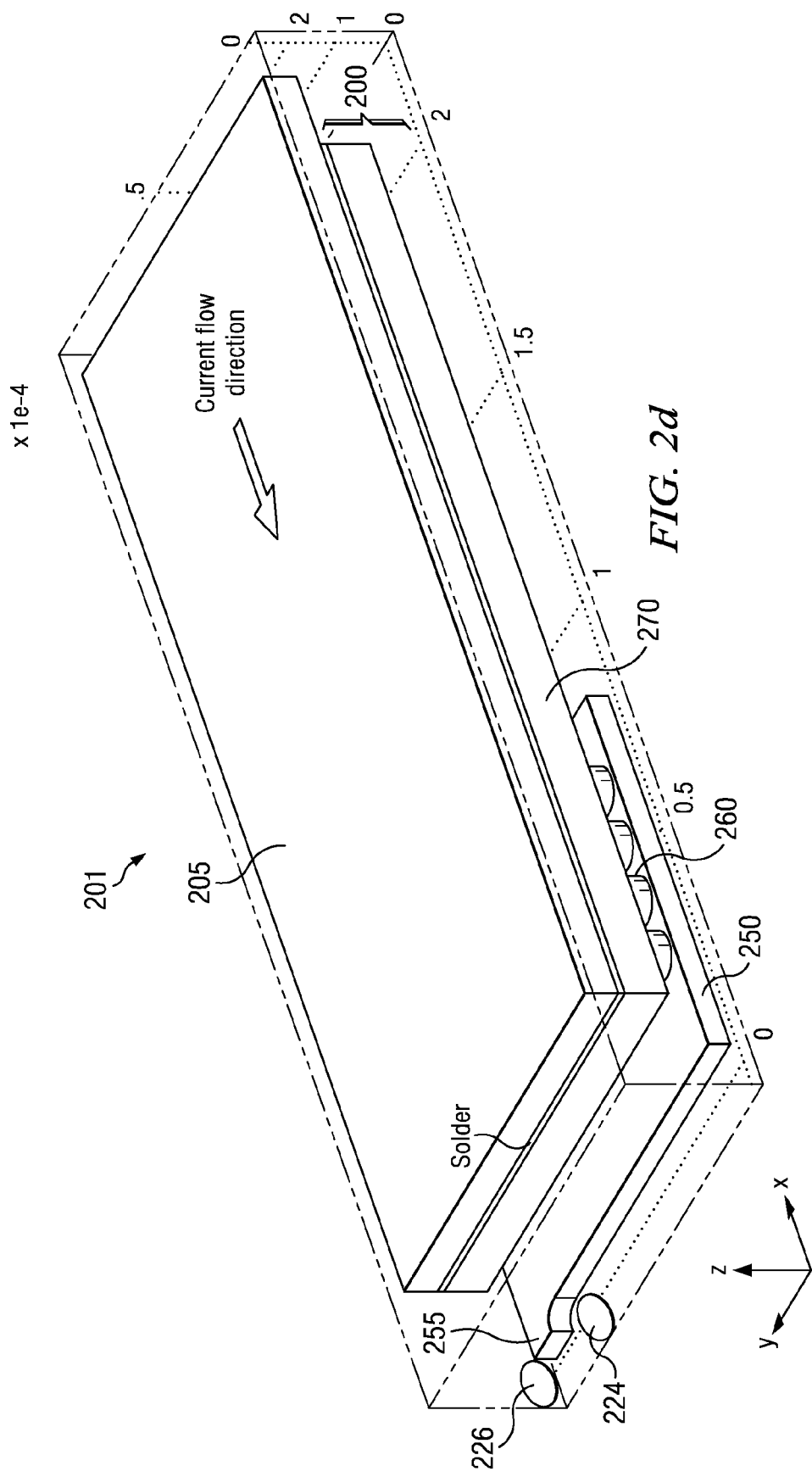
FIG. 2d shows an embodiment of a metallization system.

FIG. 2d shows a detail of a metallization system 201 of a semiconductor chip package 200 and a printed circuit board (PCB). The system shows only ¼ of the overall metallization system. A full metallization system could be designed by adding another quarter in positive y-axis direction and a half in negative x-axis direction. The cross section along the y-axis (except the metal line 205) is half the cross section of the package metallization system shown in FIG. 2b.

As discussed with regard to FIGS. 2a-2c the semiconductor chip 220 is arranged below the current rail 250 and is for the sake of simplification omitted here. The metallization system 201 comprises a current rail 250, an array of via contacts 260 disposed over the current rail 250, and a current I/O pad 270 in the semiconductor chip package 200 and a metal line 205 disposed in a printed circuit board (PCB). The metal line 205 is soldered to the current I/O pad 270.

The current rail 250 is about 50 μm thick, the current I/O pad is about 100 μm thick and the metal line 205 in the PCB is about 70 μm. Each via contact comprises a diameter of about 100 μm and a vertical thickness of about 50 μm. The current to be measured flows from the metal line 205 in the PCB through the current I/O pad 270 and the via contacts 260 to the current rail 250. The current then flows through the constriction or the reduced cross section 255 and leaves the semiconductor chip package 200 through a second portion of the metallization system comprising further contact vias and a further current I/O pad back. The constriction 255 increases the current flow and therefore increases the magnetic field strength. The increased magnetic field strength results in a more accurate measurement of the magnetic field by the semiconductor chip 220 because of reduced signal/noise ratio.

The magnetic field is measured by the functional elements 224 and 226 located in the semiconductor chip 220. The second functional element 226 is made visible for the sake of clarity in FIG. 2d. In this perspective the second functional element 226 would not be visible because it is located behind and under the current rail 250. In one embodiment the second functional element is optional.

In one embodiment a third functional element is arranged in the semiconductor chip 220 (not shown).

Referring now to FIG. 3, there is shown a flow chart of a method 300 for manufacturing a semiconductor chip package. In a first step 310 a semiconductor chip is placed on a substrate. The semiconductor chip may be a stand-alone device or an integrated circuit. In a second step 320, a first packaging material layer is formed adjacent and above the semiconductor chip. The packaging material layer may be removed above the semiconductor chip. The first packaging material layer may comprise the same materials as the packaging material layer described above with respect to FIG. 2a.

In an optional step 330, an isolation layer is formed above the semiconductor chip. The isolation layer may be an oxide, a nitride, or a polimid. In one embodiment the isolation layer is a second packaging material layer. Alternatively, when the isolation layer is provided with the semiconductor chip the isolation layer may not be formed on the semiconductor chip.

In a further step 340, a current rail is formed over the isolation layer. The current rail may be deposited as a metal layer comprising copper, aluminum, tungsten or combinations thereof. In one embodiment the current rail is provided as on-chip metallization so that the step 340 can be omitted.

In a fifth step 350, a second (or third) packaging material layer may be deposited over the current rail, the first packaging material layer and the semiconductor chip. Openings may be formed in the second (or third) packaging material layer in a next step 360. The openings may form a via or a plurality of vias/array of vias. At the same time or later an opening is formed to form a contact to the chip pad. The second (third) packaging material layer may comprise the same materials as the packaging material layer described with respect to FIG. 2a.

In a further step 370, the vias may be filled with a conductive material such as a metal. For example, the vias may be filled with an electro plating process or an e-less plating process. Alternatively, the vias may be filled using a galvanic bath or a deposition process such as a PVD process (e.g., sputter technologies), plasma dust deposition or a CVD process (e.g., metal organic CVD). At the same time or later routing metallization may be formed in the second (or third) packaging material layer.

In a last step 380, the I/O pads are formed. The I/O pads may be formed at the same time or later than the formation of the via contacts and/or routing. For example, the I/O pads may be formed at the same time when the routing formation and/or the via fill is performed. Alternatively, the I/O pads may be formed in a separate process. For example, after forming the routing and the via contacts a further (third or fourth) packaging material layer may be formed and the I/O pads are formed in this laminate layer. The third (fourth) packaging material layer may comprise the same materials as the packaging material layer described with respect to FIG. 2a.

The first packaging material layer, the second packing material layer and the third packaging material layer (and fourth packaging material layer) each comprises the same material. Alternatively, each packaging material layer comprises a different material or a different material composition than at least one of the other packaging material layers. The package may be formed from 4 to 5 different packaging material layers or under some circumstances from up to 10 to 15 packaging material layers.

The steps 310-380 do not need to be carried out in the order shown. The order may be changed or modified. For example the semiconductor chip may be placed on the substrate after a packaging material layer is formed on the substrate.

FIG. 4 shows a flow chart of a method 400 to measure a current with a Hall sensor. In a first step 410, a current is received at a first I/O current pad of a Hall sensor package. The current is received from a printed circuit board, for example. In a second step 420, the current flows through a first array of via contacts to a first portion of the current rail. The current flows along a first portion of a current rail, the first portion of the current rail being disposed adjacent a Hall sensor. The Hall elements of the Hall sensor measure the magnetic field produced by the current flow, step 430. The Hall sensor may measure the magnetic field at a location where the current flows through a constricted portion of the current rail.

In a fourth step 440, the current flows through a second portion of the current rail, a second array of via contacts and a second current I/O pad. In a next step 450, the current leaves the Hall sensor chip package and flows back into the printed circuit board (PCB). In a final step 460, a signal is provided at a sensor I/O pad in response to current measured current. The Hall sensor provides this signal through a metal routing connecting the Hall sensor to the sensor I/O pad in the Hall sensor chip package.

In one embodiment the current flow in the via contact is orthogonal to the current flow in the current rail.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device package comprising:
    a substrate;
    a semiconductor chip disposed on the substrate and laterally surrounded by a packaging material;
    a current rail adjacent the semiconductor chip, wherein the current rail is isolated from the semiconductor chip by an isolation layer, and wherein the current rail comprises a bottleneck;
    a first external pad; and
    a via contact contacting the current rail with the first external pad.

2. The package according to claim 1, wherein the via contact comprises a plurality of vertical via contacts.

3. The package according to claim 1, wherein the semiconductor chip comprises Hall elements arranged on a first side of the semiconductor chip.

4. The package according to claim 3, wherein the semiconductor chip comprises a second side in contact with the substrate, and wherein the second side is opposite to the first side.

5. The package according to claim 1, wherein the current rail, the first external pad and the via contact comprise Cu.

6. The package according to claim 1, wherein the packaging material comprises an epoxy material.

7. The package according to claim 1, wherein the packaging material comprises a plurality of laminate material layers.

8. The package according to claim 1, wherein the isolation layer between the current rail and semiconductor chip comprises silicon oxide, silicon nitride, a laminate material, or a combination thereof.

9. The package according to claim 1, wherein the isolation layer is about 3 μm to about 20 μm thick.

10. The package according to claim 1, further comprising a second external pad electrically coupled to the semiconductor chip.

11. The package according to claim 1, wherein the current rail is not-perforated.

12. The package according to claim 11, wherein the via contact is wider than it is high.

13. A system comprising:
    a printed circuit board (PCB);
    a packaged semiconductor device according to claim 10; and
    solder contacts contacting the first external pad and the second external pad to the PCB.

14. A multi-chip package comprising:
    a substrate;
    a Hall sensor disposed on the substrate;
    at least one further semiconductor chip disposed on the substrate;
    a packaging material layer laterally surrounding the Hall sensor and the at least one further semiconductor chip;
    a current rail adjacent the Hall sensor, wherein the current rail is not-perforated, and wherein the current rail is isolated from the Hall sensor by an isolation layer;
    an external pad; and
    a via contact contacting the current rail with the external pad.

15. The multi-chip package according to claim 14, wherein the via contact is vertically disposed over the current rail, and wherein the external pad is disposed over the via contact.

16. The multi-chip package according to claim 14, wherein the isolation layer between the current rail and Hall sensor comprises silicon oxide, silicon nitride, a laminate material, a composite material, or a combination thereof.

17. A semiconductor device package comprising:
    a substrate;
    a semiconductor chip disposed on the substrate and laterally surrounded by a laminate material layer comprising a laminate material;

a current rail adjacent the semiconductor chip, wherein the current rail is not-perforated, and wherein the current rail is isolated from the semiconductor chip by an isolation layer;

a first external pad; and a contact contacting the current rail with the first external pad, wherein the contact is a via contact, and wherein the first external pad is disposed over the via contact.

18. A semiconductor device package comprising:

a substrate;

a semiconductor chip laterally surrounded by a packaging material, wherein the semiconductor chip includes a sensing element, wherein the sensing element is located at a top side, and wherein a bottom side is disposed on the substrate;

a current rail disposed on the top side of the semiconductor chip, wherein the current rail is not-perforated, and wherein the current rail is isolated from the semiconductor chip by an isolation layer;

a first external pad disposed on the current rail; and a via contact contacting the current rail with the first external pad.

19. The package according to claim 18, wherein the via contact comprises an array of via contacts.

20. A semiconductor device package comprising:

a substrate;

a semiconductor chip disposed on the substrate and laterally surrounded by a packaging material;

a current rail adjacent the semiconductor chip, wherein the current rail is not-perforated, and wherein the current rail isolated from the semiconductor chip by an isolation layer;

a first external pad; and a via contact contacting the current rail with the first external pad.

* * * * *